United States Patent [19]

Jackson

[11] Patent Number: 5,254,879
[45] Date of Patent: Oct. 19, 1993

[54] SAFETY SWITCH ASSEMBLY

[75] Inventor: George H. Jackson, Wigan, United Kingdom

[73] Assignee: EJA Engineering PLC, Wigan, United Kingdom

[21] Appl. No.: 768,244

[22] PCT Filed: Apr. 17, 1990

[86] PCT No.: PCT/GB90/00576
§ 371 Date: Dec. 5, 1991
§ 102(e) Date: Dec. 5, 1991

[87] PCT Pub. No.: WO90/13180
PCT Pub. Date: Nov. 1, 1990

[30] Foreign Application Priority Data

Apr. 14, 1989 [GB] United Kingdom ............... 8908517
Dec. 19, 1989 [GB] United Kingdom ............... 8928646

[51] Int. Cl.⁵ ........................................... H01H 36/00
[52] U.S. Cl. .................................. 307/116; 361/144; 361/179
[58] Field of Search ............... 361/142, 143, 144, 147, 361/148, 170, 177, 180; 307/112, 116

[56] References Cited

U.S. PATENT DOCUMENTS

| 4,439,808 | 3/1984 | Gillham | 361/144 |
| 4,682,801 | 7/1987 | Cook et al. | 361/144 |
| 4,757,213 | 7/1988 | Tigges et al. | 307/116 |
| 4,910,634 | 3/1990 | Pipkorn | 361/147 |

FOREIGN PATENT DOCUMENTS 0127561 4/1984 European Pat. Off. .
1809100 11/1968 Fed. Rep. of Germany .
2084172 3/1971 France .

Primary Examiner—Jeffrey A. Gaffin
Attorney, Agent, or Firm—Spensley Horn Jubas & Lubitz

[57] ABSTRACT

A safety switch having first and second elements intended to be mounted on components of a safety enclosure that are moveable relative to one another. The first and second elements are in a predetermined relative position adjacent each other when the enclosure is in a closed condition and spaced apart when the enclosure is in an open condition. A source of magnetic flux is mounted on one element and a magnetically operable switch is mounted on the other element. The magnetically operable switch is arranged so as to be switched by the magnetic flux generated by the source when the elements are moved adjacent to each other. A pair of tuned circuits are mounted one in each of the elements, and a switching circuit is connected to one of the tuned circuits. The switching circuit is arranged so as to be switched when the elements are moved adjacent to each other. An output circuit indicates that the enclosure is not closed unless both the magnetically operable switch and the switching circuit indicate that the two elements are adjacent to each other.

4 Claims, 1 Drawing Sheet

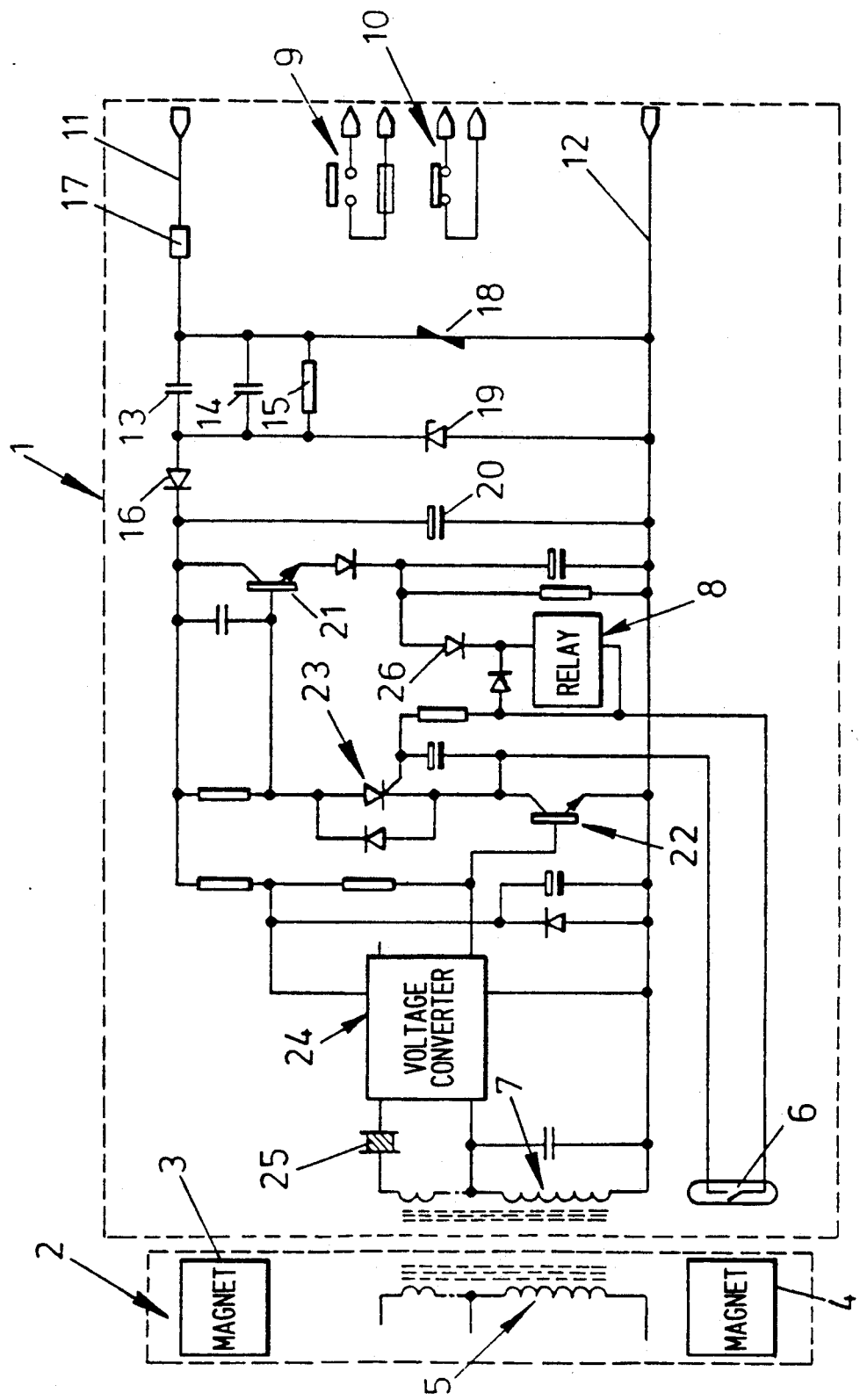

SAFETY SWITCH ASSEMBLY

BACKGROUND OF THE INVENTION

1. Field of the Invention

The present invention relates to a safety switch assembly and in particular to a safety switch assembly capable of indicating whether or not a safety enclosure protecting an item of machinery has been correctly closed.

2. Description of the Related Art

Safety switch assemblies are known which comprise first and second elements intended to be mounted on relatively movable components of the safety enclosure, the first and second elements being in a predetermined relative position adjacent to each other when the enclosure is in a closed condition and spaced apart when the enclosure is opened. The known safety switch assemblies provide an output indicating whether or not the enclosure has been correctly closed, the output being used to disable machinery protected by the enclosure when the enclosure has not been properly closed.

In one known safety switch assembly, a permanent magnet is mounted on one element and a magnetically operated switch is provided on the other element. When the two elements are close together, the permanent magnet causes a magnetic reed switch to close, thereby enabling operation of the machine. When the two elements are spaced apart the output disables the machine. The known magnetically operated safety switch assemblies provide acceptable characteristics but it is relatively easy for a machine operator to disable a safety switch assembly simply by placing a permanent magnet adjacent the magnetically operated switch so that the safety switch assembly is in effect rendered inoperative.

In another known safety switch assembly, one of the elements is provided with a tuned circuit which is energised to generate an electromagnetic field in its immediate vicinity. The other element supports a passive tuned circuit which when close to the active element is electromagnetically coupled to it so that an output derived from the active element indicates the presence of the passive element. The problem with this arrangement is that the circuitry is vulnerable to interference from electromagnetic signal sources in its vicinity and can provide an erroneous output. In particular, where the active tuned circuit is driven by a signal generated remotely, conductors connecting the signal source to the active element can themselves pick up spurious signals with the result that the output of the safety switch assembly cannot be relied upon.

It is an object of the present invention to obviate or mitigate the problems associated with known safety switch assemblies as outlined above.

SUMMARY OF THE INVENTION

According to the present invention, there is provided a safety switch assembly comprising first and second elements intended to be mounted on relatively movable components of a safety enclosure, the first and second elements being in a predetermined relative position adjacent each other when the enclosure is in a closed condition and spaced apart when the enclosure is in an open condition, wherein the assembly comprises a source of magnetic flux mounted on one element and a magnetically operable switch mounted on the other element, the magnetically operable switch being arranged so as to be switched by the magnetic flux generated by the source when the said one element is moved from a position spaced from the said other element to the said predetermined relative position adjacent the said other element, the assembly comprises a pair of tuned circuits mounted in respective ones of the elements and a switching circuit connected to one of the tuned circuits, the switching circuit being arranged so as to be switched when the said one element is moved from a position spaced from the said other element to the said predetermined relative position adjacent the said other element, and the assembly comprises an output circuit arranged to indicate that the enclosure is not closed unless both the magnetically operable switch and the switching circuit indicate that the two elements are in the predetermined relative position adjacent to each other.

Preferably, the magnetically operable switch, an active tuned circuit, the switching circuit and the output circuit are mounted on one of the elements, the other element supporting one or more permanent magnets and a passive tuned circuit which is electromagnetically coupled to the active tuned circuit when the two elements are positioned adjacent to each other. The output circuit may be arranged to indicate that the enclosure is open unless the magnetically operable switch is switched before the switching circuit is switched. Preferably the element or elements supporting the active circuit elements are simply provided with a power input so that there are no conductors extending to that element which can pick up spurious electromagnetic signals.

BRIEF DESCRIPTION OF THE DRAWINGS

An embodiment of the present invention will now be described, by way of example, with reference to the accompanying drawing which is a circuit diagram of a safety switch assembly according to the present invention.

DESCRIPTION OF THE PREFERRED EMBODIMENT

Referring to the drawing, the safety switch assembly comprises two basic elements, that is an active switching arrangement 1 which in use is mounted for example on the framework of an enclosure at or adjacent a door opening of the enclosure, and an actuator 2 which in use is mounted on the enclosure door. When the door is closed, the active switching arrangement 1 and actuator 2 are in the relative positions shown adjacent to each other. When the door is open, the two basic elements of the assembly are moved apart.

The actuator 2 comprises two magnets 3, 4 and a tuned circuit 5. The two magnets 3, 4 are positioned such that if the actuator is inverted from the position shown the operation of the circuitry is not affected. The switching circuit 1 comprises a magnetically operated reed switch 6 and a tuned circuit 7. As described in more detail below, with the actuator 2 in the position shown, a relay 8 is energised, thereby switching associated contacts 9 and 10. If the contacts 9 are open a machine located within the enclosure is disable. The contacts 10 can be used for any convenient purpose, for example to indicate that the enclosure door is not fully closed.

In more detail, the live terminal of an AC supply is connected to input 11, an the neutral terminal of the AC supply is connected to input 12. The supply voltage is converted to an appropriate level (e.g. 24 volts) by components 13, 14 and 15 and rectified by diode 16 to provide a DC supply to the remainder of the circuitry. An input fuse 17 provides excess current protection, an AC suppression filter 18 suppresses noise on the main supply, a zener diode 19 clamps the voltage to a desired maximum level to neutralise any faults which might occur in the power supply, and a capacitor 20 smoothes the DC voltage supplied to the remainder of the circuitry. The circuit can be adapted to the various supply voltages, e.g. 240 or 110 volts, simply by adjusting the values of the components 13 to 15.

The relay 8 is energised only if two transistors 21, 22 are both fully conductive. The transistor 21 is rendered conductive by the reed switch 6 which when closed by the magnet 4 causes a thyristor 23 to bias the transistor 21 to its conductive state, assuming that the transistor 22 is not conductive when the reed switch 6 closes. The transistor 22 is rendered conductive by a frequency to voltage converter 24, which may be for example a TCA 105 integrated circuit. A crystal 25 energises the active tuned circuit 7 and, in the absence of the passive tuned circuit 5, the output of the tuned circuit 7 is sufficient to cause the output of the circuit 24 to hold the transistor 22 in its non-conductive state. When the tuned circuit 5 is in the position shown, it absorbs energy from the tuned circuit 7 and the amplitude of the output of the tuned circuit 7 is thereby reduced. This causes the output of the circuit 24 to switch, turning on transistor 22.

Thus, in normal operation, as the enclosure door is closed, the reed switch 6 is closed, and the transistor 21 is primed, that is held in its conductive state. As the transistor 22 is still in its non-conductive state, no current flows to the relay 8. When the door is subsequently moved to the fully closed position, the circuit 24 turns on the transistor 22. The relay 8 is then fully energised, enabling the energisation of the machine located within the enclosure via the contacts 9. An LED 26 indicates that the door is closed.

If the transistor 22 is turned on when the reed switch 6 is open, for example as the result of a fault in the tuned circuit 7 or the presence of spurious electromagnetic signals in the region of the tuned circuit 7, subsequent closure of the reed switch 6 cannot turn on the transistor 21 and thus the machine is disabled until the fault is rectified.

I claim:

1. A safety switch assembly comprising first and second elements intended to be mounted on components of a safety enclosure that are moveable relative to one another, the first and second elements being in a predetermined relative position adjacent each other when the enclosure is in a closed condition and spaced apart when the enclosure is in an open condition, wherein the assembly comprises a source of magnetic flux mounted on one element and a magnetically operable switch 6 mounted on the other element, the magnetically operable switch 6 being arranged so as to be switched by the magnetic flux generated by the source of magnetic flux when the said one element is moved from a position spaced from the said other element to the said predetermined relative position adjacent the said other element, the assembly further comprises a pair of tuned circuits mounted in respective ones of the elements and a switching circuit connected to one of the tuned circuits, the switching circuit being arranged so as to be switched when the said one element is moved from a position spaced from the said other element to the said predetermined relative position adjacent the said other element, and the assembly further comprises an output circuit arranged to indicate that the enclosure is not closed unless both the magnetically operable switch 6 and the switching circuit indicate that the two element are in the predetermined relative position adjacent to each other.

2. A safety switch assembly according to claim 1, wherein one of the first and second elements has mounted thereon the magnetically operable switch, an active tuned circuit, the switching circuit and the output circuit, the other of the first and second elements supports one or more permanent magnets and a passive tuned circuit, the passive tuned circuit being electromagnetically coupled to the active tuned circuit when the two elements are positioned adjacent to each other.

3. A safety switch assembly according to claim 1 or 2, wherein the output circuit is arranged to indicate that the enclosure is open unless, as the elements are moved to the predetermined relative position adjacent to each other, the magnetically operable switch is switched before the switching circuit is switched.

4. A safety switch assembly according to claim 1, wherein the element or elements supporting active circuit components are provided with a power input only so that there are no conductors other than the power input which can pick up spurious electromagnetic signals.

* * * * *